United States Patent [19]
Henry

[11] 3,982,267
[45] Sept. 21, 1976

[54] PIN DIODE WITH A THICK INTRINSIC ZONE AND A DEVICE COMPRISING SUCH A DIODE

[75] Inventor: Raymond Henry, Paris, France

[73] Assignee: Thomson-CSF, Paris, France

[22] Filed: Apr. 15, 1975

[21] Appl. No.: 568,363

[30] Foreign Application Priority Data
Apr. 16, 1974 France .................. 74.13206

[52] U.S. Cl. .................. 357/52; 357/56; 357/58; 357/76
[51] Int. Cl.² .................. H01L 29/34
[58] Field of Search .................. 357/58, 52, 56, 76

[56] References Cited
UNITED STATES PATENTS

| | | | |
|---|---|---|---|
| 3,264,531 | 8/1966 | Dickson | 357/76 |
| 3,489,958 | 1/1970 | Gramberg et al. | 357/58 |
| 3,633,271 | 1/1972 | Miles et al. | 357/52 |
| 3,761,711 | 9/1973 | Hall | 357/58 |
| 3,812,717 | 5/1974 | Miller et al. | 357/58 |

Primary Examiner—Andrew J. James
Assistant Examiner—Joseph E. Clawson, Jr.
Attorney, Agent, or Firm—Cushman, Darby & Cushman

[57] ABSTRACT

Collectively manufactured PIN diodes having a thick intrinsic layer are separated from one another by any method other than chemical methods, and have a rough cut lateral surface whose surface condition regulates the leakage resistance to a controllable value, sufficiently low to be measurable.

4 Claims, 5 Drawing Figures

PIN DIODE WITH A THICK INTRINSIC ZONE AND A DEVICE COMPRISING SUCH A DIODE

The present invention relates to PIN diodes and more particularly diodes of this type the thickness of whose intrinsic zone is very substantial. This is the case, for example, with diodes utilised as variable resistors, and also in the manufacture of scanning antennas where the operating voltages are high.

The manufacture of PIN diodes whose intrinsic layer is very thick is quite difficult. In conventional techniques of manufacturing diodes of this kind chemical etching or a succession of mechanical and chemical etchings are used for separating each of the diodes from the wafer from which they have all been previously formed. Moreover, after the separation of the diodes, each of them must be subjected to a fresh chemical etching operation, before being assembled on its mounting or in its casing. A varnish coating is then required if the junction is to be protected against external agents such as moisture for example.

The rates of etching of an intrinsic semi-conductor being radically different from those of a highly doped semi-conductor, the result is that irregular lateral etching takes place and the final device does not always present the desired characteristics. Chemical etching also causes a certain number of other drawbacks. It increases the leakage resistance of the junction, which resistance may then reach quasi-infinite value, something which may on the one hand be a good quality or equally a drawback, depending upon the type of purpose in question: for example, in the case of circuits comprising series diodes, a quasi-infinite leakage resistance leads to an unknown distribution of the bias voltages at each of the diodes. If a diode is defective, the whole of the voltage will be carried by the other diode or diodes. As underlined above, chemical etching also leads to considerable sensitivity on the part of the surface to external agents, as for example moisture. To avoid this drawback, it is necessary to cover the diode by means of a protective varnish. Unfortunately, this often gives rise to phenomena of the trapping of charges at the surface, these trapped charges giving rise to very slow switching. Finally, the chemical operations are often difficult to control and are expensive. However, in numerous applications, although leakage resistances which tend towards infinity often meet with a technical requirement, they are not always absolutely essential and a less expensive method of separating diodes is therefore desirable, especially if this method leads to the obtaining of products whose leakage resistance is controllable and which, moreover, have very little sensitivity to external agents.

The present invention is concerned with PIN type diodes having an intrinsic zone which can be relatively thick, which diodes can be manufactured collectively by means of an inexpensive method. A diode in accordance with the invention is essentially characterised in that it comprises a rough cut lateral surface whose surface condition has a roughness which is a function of the means of cutting used and regulates the value of the leakage resistance of the diode thus obtained.

The invention will be better understood from a consideration of the following explanations and the attached figures where:

Similar elements carry similar references in all the figures.

Figure 1:
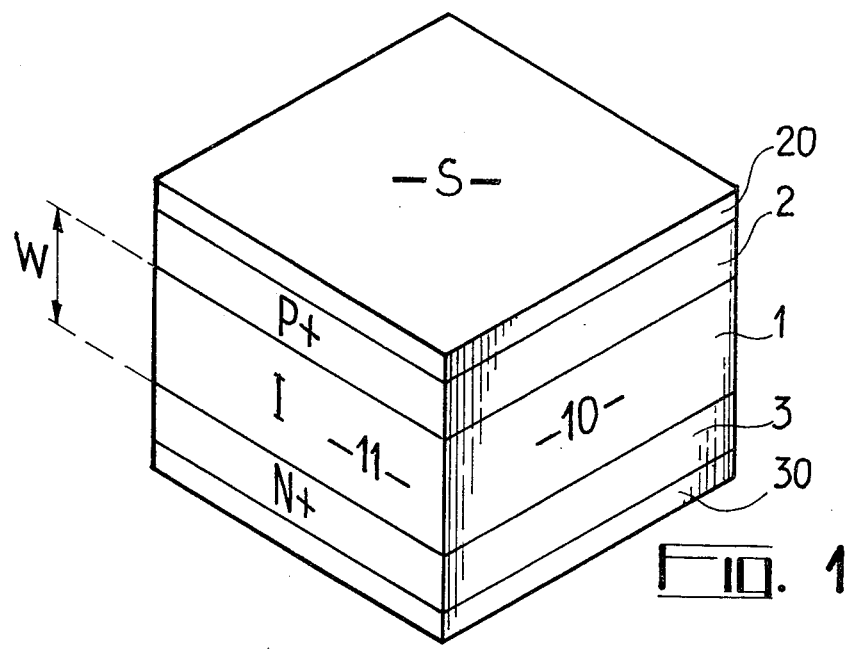
FIG. 1 illustrates a device in accordance with the invention.

FIG. 1 illustrates on a very much enlarged scale, a diode in accordance with the invention. It comprises a zone 1 of semi-conductor material of very high resistivity, this zone being of essentially intrinsic material and having two parallel faces. One of the faces carries a layer 2 of semi-conductor highly doped with a first N type or P type impurity. The opposite face carries a layer 3 highly doped with an impurity of a type opposite to that of the first impurity type.

The zones 2 and 3, in fact, are interchangeable since the finished diode has a plane of symmetry.

The zones 2 and 3 are coated with a metal layer 20 and 30. A diode of this kind, in accordance with the invention, takes the form of a tiny plate having two parallel faces of section S, comprising, amongst other things, a layer of intrinsic semi-conductor material of thickness W. It is essentially characterised in that the lateral surface of the plate is rough cut and has a given surface condition which determines the value of the leakage resistance. The section S may be arbitrary shaped (square, rectangular or circular for example). In the case of the example shown in FIG. 1, the section is square, the tiny plate then taking the form of a parallelepiped whose lateral faces such as those 10 and 11 visible in FIG. 1, are in the rough cut state. The thickness W of the intrinsic layer can vary from 70 to 250 microns. No chemical etching is required and a simple operation of cleaning the surface, following cutting, is sufficient to make the device directly ready for use.

Figure 2:
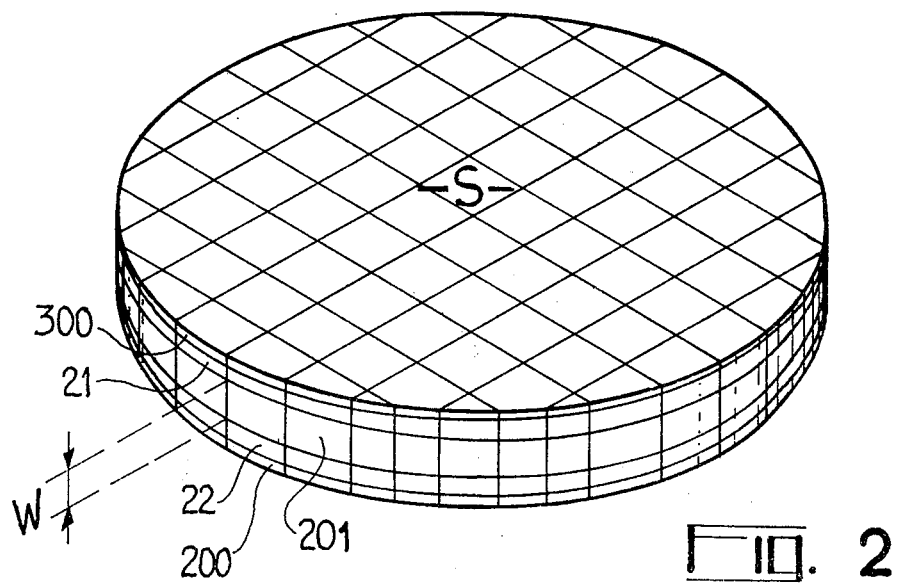
FIG. 2 is an explanatory figure.

In order to produce diodes in accordance with the invention, it is possible for example to utilise the technique of manufacture illustrated in FIG. 2 and comprising the following:

a wafer 201 of intrinsic semi-conductor material having a dimension as large as possible in the state of the art is coated on each of its faces with layers 21 and 22 which are highly P+ and N+ doped, these layers themselves being covered with metal layers 200 and 300 respectively.

Subsequently, the sandwich thus obtained is cut into individual tiny plates in accordance with the pattern shown in FIG. 2. Each of these plates, in the described example, has a square section of dimension S, as described earlier, and an intrinsic zone, thickness of W; the lateral faces are rough cut and their surface condition is determined by the cutting technique.

Experience shows that the leakage resistance of diodes is a well defined function of the surface condition of the lateral faces thereof; in the limiting condition, faces which have been subjected to chemical etching, as is the case in conventional methods of manufacturing diodes in bulk, exhibit very high leakage resistances, virtually infinite in fact.

On the other hand, in accordance with the invention, these faces are rough cut and have a surface condition which comprises a greater or lesser proportion of defects or high spots, depending upon the type of cut and the way in which the cutting machine has been set up. This surface condition is therefore controllable and consequently, the leakage resistance associated with said surface condition, is likewise controllable.

At the present date, there are available machines capable of performing this kind of cutting operation in demand. In particular, diamond disc machines or machines using wires with an extremely high finish, are known, but any cutting operation which will achieve this result can be used: thus, cutting by spark-machining or ultrasonics, making it possible to achieve any desired profile, or cutting by the use of a laser beam, etc. can be used.

The leakage resistances presented by diodes of this kind can reach values of the order of 1 megohm or some tens of megohms.

Figure 3:
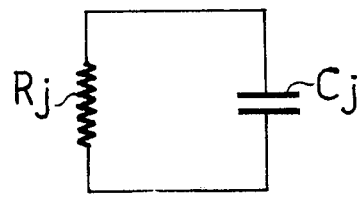
FIGS. 3 and 4 are two explanatory diagrams pertaining to the operation of a device as shown in FIG. 1.

FIG. 3 illustrates the equivalent diagram, of a diode in accordance with the invention in the blocked condition. It comprises a resistance $R_j$ in parallel with the junction capacitance $C_j$. The value of this capacitance is a function of the area S of the junction, of the dielectric constant $\epsilon$ of the intrinsic layer and of the thickness W of the latter, and satisfies the formula $C_j = \epsilon S/W$ for a sufficient reverse voltage. The value of the leakage resistance $R_j$ can be matched to each particular desired application. However, it must be very much greater than $1/C_j\omega$ ($\omega$ being the angular frequency of operation of the device).

Figure 4:
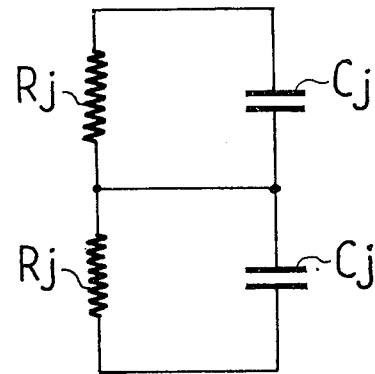

The equivalent circuit diagram of two series connected diodes, has been shown in FIG. 4, this latter clearly showing the controlled distribution of the reverse bias voltage between the junction terminals.

Another advantage of the invention resides in the fact that if, prior to the final assembly of the diode in its casing, measurement of the variation of its leakage resistance as a function of the temperature rise at the junction, is made, it is a simple matter in turn to deduce from the variation in the leakage resistance of the diode in operation, the junction temperature, something it would be impossible to do were the leakage resistance too high.

The rough cut surface can be limited to one of the two PI or IN junctions, the other being chemically etched and protected by a known method (silica, glass, varnish). In this case, the leakage resistance is substantially higher without, however, reaching the quasi-infinite value of the conventional case where the two junctions are both chemically etched. This procedure may be preferred to the first if the operating temperature of the device is high.

It may, in order words, be desirable to manufacture devices having leakage resistances in a somewhat higher order, for example in the order of some tens to some hundreds to megohms: a variant embodiment in accordance with the invention achieves this result. This variant embodiment, shown in FIG. 5 and having recourse to the techniques described earlier, leads to a relatively low cost price and has a supplementary advantage:

the existence of a passive junction between one of the highly doped zones and the intrinsic zones. Layers 2 and 3 highly doped using impurities of the opposite conductivity type, are respectively deposited by diffusion or by epitaxy, at either side of a wafer of intrinsic semi-conductor 1. By means of conventional methods diodes, mesa etching is carried out which is limited to a depth such that the highly doped semi-conductor layer in question (in the present instance, the P+ layer 2) is etched as well as a small thickness of the underlying intrinsic layer 1. Since this etching is a relatively short operation and only involves a small thickness of the intrinsic material, the drawbacks of chemical etching of PIN diodes are avoided.

The flanks of the mesa structures are protected by means of a passivating material 33. The device furthermore comprises metal layers 34 and 35.

Figure 5:
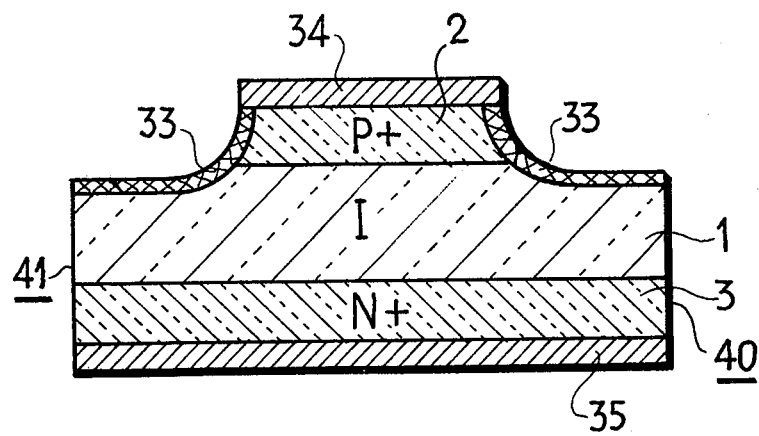
FIG. 5 is a variant embodiment.

The diode therefore takes the form described in FIG. 1, but it also, as FIG. 5 shows, comprises a zone having the form of a mesa whose flanks extend over the whole thickness of one of the highly doped layers and which very slightly overlaps the intrinsic semi-conductor plate laying directly underneath. The mesa flanks covered by the passivating material join up with the lateral faces which, as in the case of FIG. 1, are rough cut. The lateral faces visible in FIG. 5 are the faces 40 and 41. This passivation co-operates with the rough cut lateral faces to create a higher leakage resistance than in the case of the diode shown in FIG. 1, although the resistance is nevertheless very far from the virtually infinite values encountered in the mesa diode produced by conventional techniques of manufacture.

The diodes in accordance with the invention can be utilised in numerous application and in a general way, whenever the thickness of the intrinsic semi-conductor zone has to be relatively substantial, as is the case with the diodes utilised in variable resistors or with diodes used in the manufacture of scanning antennas. These diodes are distinguished by the value of their leakage resistance and their insensitivity to external agents and to humidity in particular.

What I claim is:

1. A PIN diode comprising an intrinsic semi-conductor plate having two opposite faces respectively carrying a first and a second semi-conductor layer, highly doped with an impurity of a given type in the case of the first layer and with a impurity of opposite type in the case of the second, and a lateral surface having a degree of roughness giving to the leakage resistance a value, lower than few hundred megohms.

2. A diode as claimed in claim 1, comprising a mesa portion having flanks extending over the whole thickness of said first layer, and very slightly overlapping that part of said intrinsic semi-conductor plate which is located directly underneath, said flanks being covered with a passivating material and join said lateral surface, co-operating therewith in order to regulate the value of said leakage resistance.

3. A diode as claimed in claim 1, wherein lateral surface is rough cut.

4. A diode as claimed in claim 1, that it said two external surfaces carrying respective metal coating.

* * * * *